United States Patent
Uchizawa

(10) Patent No.: US 11,802,912 B2
(45) Date of Patent: Oct. 31, 2023

(54) OUTPUT MODULE FOR INDUSTRIAL CONTROL DEVICE, AND INDUSTRIAL CONTROL DEVICE

(71) Applicant: DENSO WAVE INCORPORATED, Aichi-pref. (JP)

(72) Inventor: Riho Uchizawa, Chita-gun (JP)

(73) Assignee: DENSO WAVE INCORPORATED, Aichi-pref. (JP)

( * ) Notice: Subject to any disclaimer, the term of this patent is extended or adjusted under 35 U.S.C. 154(b) by 0 days.

(21) Appl. No.: 17/868,177

(22) Filed: Jul. 19, 2022

(65) Prior Publication Data

US 2023/0062064 A1    Mar. 2, 2023

(30) Foreign Application Priority Data

Aug. 30, 2021 (JP) ................................. 2021-140020

(51) Int. Cl.
*G01R 31/327* (2006.01)

(52) U.S. Cl.
CPC .................................. *G01R 31/327* (2013.01)

(58) Field of Classification Search
CPC ........................... G01R 31/327; G01R 31/3278
See application file for complete search history.

(56) References Cited

U.S. PATENT DOCUMENTS

| 2013/0320986 A1 | 12/2013 | Shiraishi et al. |
| 2016/0084908 A1 | 3/2016 | Shiraishi et al. |
| 2020/0259321 A1* | 8/2020 | Morishita .......... G01R 31/3278 |
| 2021/0273634 A1* | 9/2021 | Djelassi-Tscheck ... H02H 5/041 |

FOREIGN PATENT DOCUMENTS

| JP | 2016-192897 A | 11/2016 |
| JP | 2019-020822 A | 2/2019 |

* cited by examiner

*Primary Examiner* — Alvaro E Fortich
*Assistant Examiner* — Adam S Clarke
(74) *Attorney, Agent, or Firm* — Oliff PLC

(57) ABSTRACT

An output module comprising an output circuit and a control unit and an industrial control device including the output module are provided. The output circuit includes switches connected in parallel with each other, a specific power supply provided for each switch, and a current detection unit that is provided for each switch and, in response to an application of a function diagnosis voltage from the specific power supply, outputs a current signal indicating whether an applied current has flowed through the switch, to the control unit. The control unit determines a diagnosis target switch, and based on the current signal from the current detection unit, conducts the function diagnosis including determination as to whether opening control is normally active for at least the diagnosis target switch, while leaving at least any one switch other than the diagnosis target switch in a closed state.

9 Claims, 6 Drawing Sheets

FIG.2

| PURPOSE | SwA | SwB | SwCa | SwCb | READBACK EXPECTATION VALUE |
|---|---|---|---|---|---|
| 1. INITIALIZATION | Close | — | — | — | — |
| 2. PREPARATION FOR SwA TEST | Open | — | — | — | — |
| 3. OPENING FUNCTION TEST ON SwA | — | — | PULSE INPUT | — | PULSE INPUT UNDETECTED |
| 4. CLOSURE FUNCTION TEST ON SwA | — | — | PULSE INPUT | — | PULSE INPUT DETECTED |
| 5. OPENING FUNCTION TEST ON SwB | — | — | — | PULSE INPUT | PULSE INPUT UNDETECTED |
| 6. CLOSURE FUNCTION TEST ON SwB | — | — | — | PULSE INPUT | PULSE INPUT DETECTED |

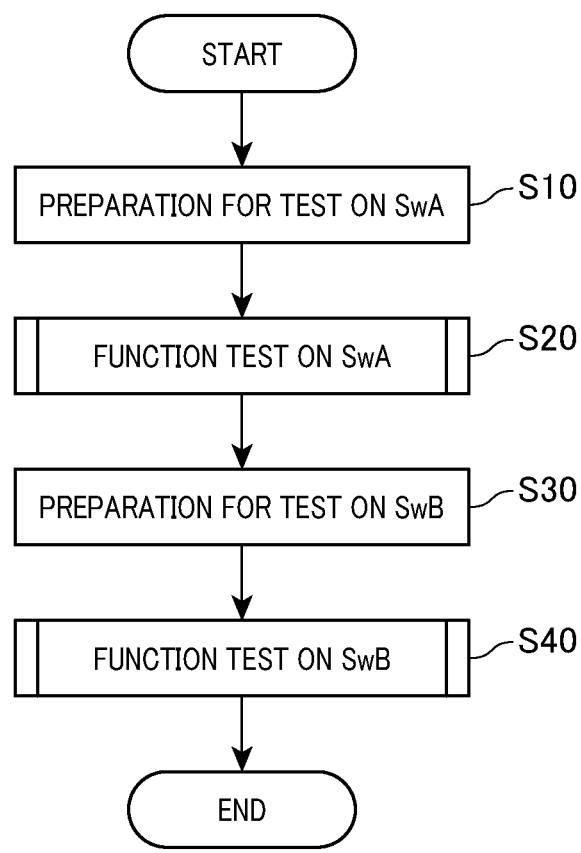

OUTPUT MODULE FOR INDUSTRIAL CONTROL DEVICE, AND INDUSTRIAL CONTROL DEVICE

CROSS-REFERENCE TO RELATED APPLICATION

This application is based on and claims the benefit of priority from earlier Japanese Patent Application No. 2021-140020 filed Aug. 30, 2021, the description of which is incorporated herein by reference.

BACKGROUND OF THE INVENTION

Technical Field of the Invention

The present disclosure relates to an output module for an industrial control device and to the industrial control device.

Related Art

An industrial control device such as a programmable logic controller (PLC), for example, includes an output module for performing predetermined output control in accordance with an instruction received from the CPU module that controls the overall operation of the industrial control device.

SUMMARY

An aspect of the present disclosure provides an output module for an industrial control device, the output module comprising:
an output circuit to be connected to a load supplied with power from a main power supply; and
a control unit configured to control the operation of the output circuit to control the supply of the power from the main power supply to the load, wherein the output circuit includes
two or more switches connected in parallel with each other and configured to switch between the supply and the cutoff of the power from the main power supply to the load,
a specific power supply separate from the main power supply, provided for each of the switches between the corresponding switch and a junction point in the parallel connection of the switches, and configured to apply a function diagnosis voltage used for a function diagnosis of the corresponding switch, and
a current detection unit provided for each of the switches and configured to, in response to the application of the function diagnosis voltage, output a current signal indicating whether an applied current has flowed through the switch, to the control unit; and
the control unit conducts a function diagnosis including at least determination as to whether opening control is normally active for a diagnosis target switch to be subjected to the function diagnosis among the switches based on the current signal from the current detection unit, while leaving at least any one switch other than the diagnosis target switch in a closed state.

BRIEF DESCRIPTION OF THE DRAWINGS

In the accompanying drawings:
FIG. 2 is a table showing the open or closed state of switches and specific switches and expectation values of readback signals in processing including switch function diagnosis conducted by the output module;
FIG. 3 is a main flowchart showing the process of the switch function diagnosis conducted by the output module according to the first embodiment.

DETAILED DESCRIPTION OF THE PREFERRED EMBODIMENTS

Figure 1:
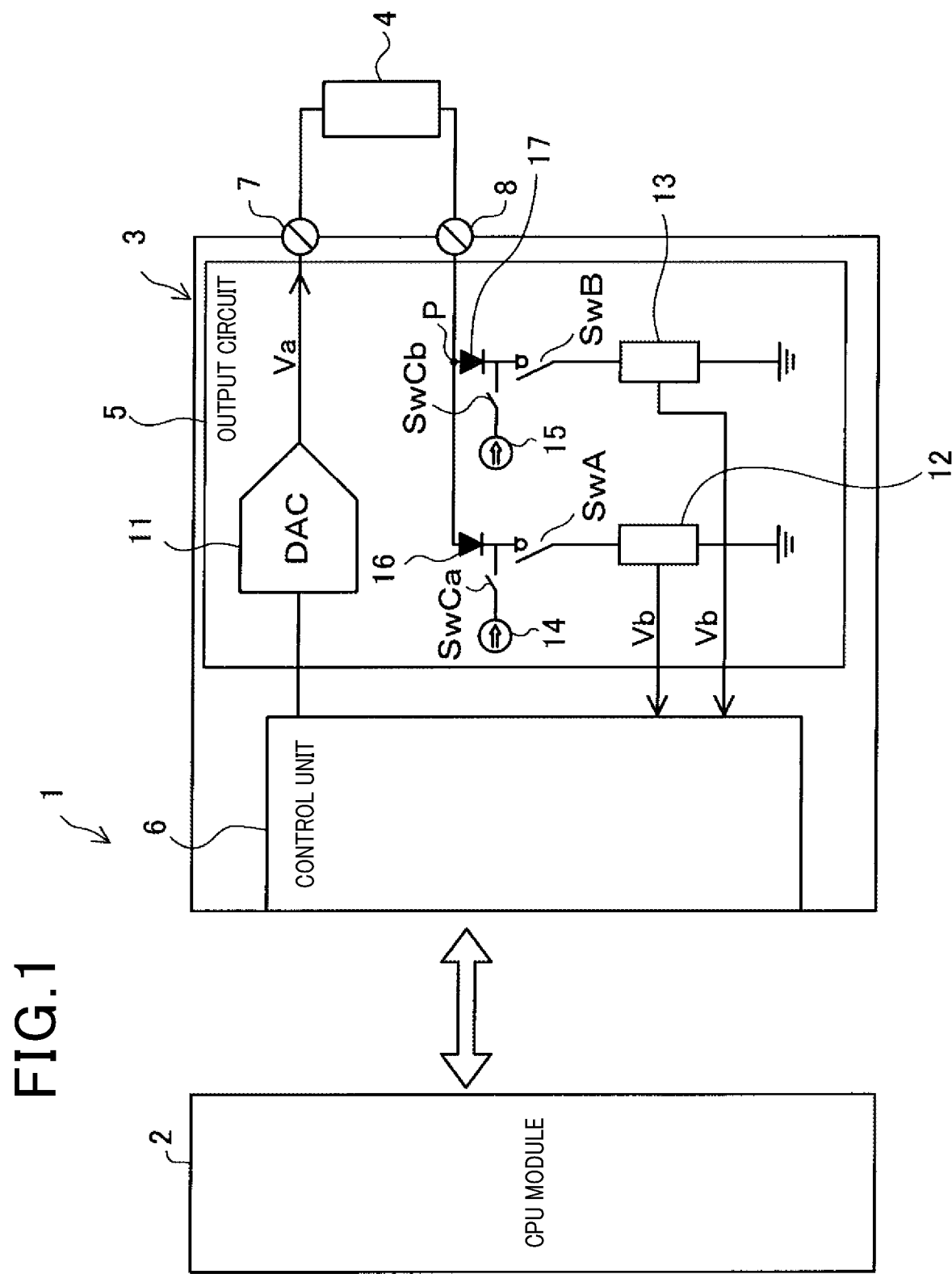
FIG. 1 is a schematic block diagram of an output module for a PLC according to a first embodiment of the present disclosure.

For example, as described in JP 2019-20822 A, an industrial control device such as a programmable logic controller (PLC) includes an output module for performing predetermined output control in accordance with an instruction received from the CPU module that controls the overall operation of the industrial control device.

As the above output control, the output module controls, for example, the supply of electric power to an external load connected to the output module. The output module that performs such output control includes an output circuit connected to a load to which a power supply voltage is provided, and a control unit that controls the operation of the output circuit. The output circuit may include, for example, a switch that cuts off the supply of electric power to the load, and a current detection unit that performs a readback to return a current signal having passed through the switch, to the control unit.

For functional safety purposes, the output module for a PLC needs output diagnosis for verifying whether the capability of the output circuit to cut off the supply of electric power to the load, or the capability to turn off the output circuit, is working properly.

In this output diagnosis, the switch is first opened, and a readback value from the current detection circuit is read. After confirmation that no current is flowing, the switch is closed. However, the output module turns off the switch during the diagnosis, and as a result, the supply of electric power to the load stops.

Some output circuits include multiple switches to achieve the redundancy of output control in a PLC. This arrangement allows, with one switch closed to ensure the flow of power to the load, the other switches to be subjected sequentially to function diagnosis by opening the specific switches sequentially. However, also in this arrangement, when the output to the load is zero, the presence or absence of the capability of turning off the output circuit cannot be determined by turning off the switches because the readback value is 0 mA.

The present disclosure has been made in view of the above, and an object of the disclosure is to provide an output module that allows the capability of turning off the output circuit to be diagnosed without cutting off the power fed to a load during the diagnosis and even with zero output to the load, and also to provide an industrial control device including the output module.

The present disclosure has been made to solve at least some of the above-described issues and may be embodied in the aspects described below.

(1) An aspect of the present disclosure provides an output module for an industrial control device, the output module comprising:

an output circuit to be connected to a load supplied with power from a main power supply; and a control unit configured to control the operation of the output circuit to control the supply of the power from the main power supply to the load, wherein the output circuit includes two or more switches connected in parallel with each other and configured to switch between the supply and the cutoff of the power from the main power supply to the load, a specific power supply separate from the main power supply, provided for each of the switches between the corresponding switch and a junction point in the parallel connection of the switches, and configured to apply a function diagnosis voltage used for a function diagnosis of the corresponding switch, and a current detection unit provided for each of the switches and configured to, in response to the application of the function diagnosis voltage, output a current signal indicating whether an applied current has flowed through the switch, to the control unit; and wherein the control unit determines conducts a function diagnosis including determination as to whether opening control is normally active for a diagnosis target switch to be subjected to the function diagnosis among the switches based on the current signal from the current detection unit, while leaving at least any one switch other than the diagnosis target switch in a closed state.

In the output module for an industrial control device according to the aspect, the output circuit includes the parallel-connected switches, the specific power supply provided for each switch between the switch and the junction point, and the current detection unit provided for each switch. Based on the current signal from the current detection unit, the control unit conducts the function diagnosis including determination as to whether opening control is normally active for at least the diagnosis target switch, while leaving at least any one switch in a closed state. The phrase "opening control is normally active for the diagnosis target switch" means that the output circuit can be properly turned off to stop the operation of the load in an emergency. According to the above aspect, the power to the load is not cut off during such a function diagnosis of the switch because at least any one switch other than the diagnosis target remains closed.

Furthermore, the specific power supply applies the function diagnosis voltage, and the diagnosis is conducted based on the current signal indicating whether the applied current has flowed through the diagnosis target switch. Thus, the function diagnosis is allowed even with zero output from the main power supply for supplying power to the load. That is, according to this aspect, the capability of turning off the output circuit can be diagnosed without cutting off the power fed to the load in the diagnosis and even with zero output to the load.

(2) In the output module for an industrial control device according to the aspect, the control unit, in the function diagnosis, opens the diagnosis target switch and reads the current signal from the current detection unit corresponding to the diagnosis target switch in response to the application of the function diagnosis voltage from the specific power supply corresponding to the diagnosis target switch, and in response to determination that the applied current has not flowed through the diagnosis target switch, the control unit may diagnose the opening control for the diagnosis target switch as being normally active, and in response to determination that the applied current has flowed through the diagnosis target switch, the control unit may diagnose the opening control for the diagnosis target switch as not being normally active.

In the output module for an industrial control device according to the aspect, with the diagnosis target switch open, the function diagnosis voltage is applied from the specific power supply corresponding to the diagnosis target switch. As a result, if the applied current has not flowed through the diagnosis target switch, the opening control can be diagnosed as being normally active. If the applied current has flowed through the diagnosis target switch, the opening control can be diagnosed as not being normally active.

(3) In the output module for an industrial control device according to the aspect, the control unit, in the function diagnosis, closes the diagnosis target switch and reads the current signal from the current detection unit corresponding to the diagnosis target switch in response to the application of the function diagnosis voltage from the specific power supply corresponding to the diagnosis target switch, and in response to determination that the applied current has flowed through the diagnosis target switch, the control unit may diagnose the closure control for the diagnosis target switch as being normally active, and in response to determination that the applied current has not flowed through the diagnosis target switch, the control unit may diagnose the current detection unit corresponding to the diagnosis target switch as being faulty.

In the output module for an industrial control device according to the aspect, with the diagnosis target switch closed, the function diagnosis voltage is applied from the specific power supply corresponding to the diagnosis target switch. As a result, if the applied current has flowed through the diagnosis target switch, the closure control can be diagnosed as being normally active. If the applied current has not flowed through the diagnosis target switch, the current detection unit corresponding to the diagnosis target switch can be determined to be faulty. That is, a fault can be detected in the current detection unit as well as in the capability of opening and closing the switch.

(4) In the output module for an industrial control device according to the aspect, the applied current associated with the function diagnosis voltage applied by the specific power supply may have a value greater than the value of a current supplied from the main power supply.

In the output module for an industrial control device according to the aspect, the value of the applied current associated with the function diagnosis voltage supplied from the specific power supply is greater than the value of the current associated with the power supplied from the main power supply, and thus the function diagnosis voltage allows the current signal of the applied current to be read clearly, enabling easy and accurate function diagnosis.

(5) In the output module for an industrial control device according to the aspect, each specific power supply and the switch corresponding to the specific power supply may have a specific switch between them.

In the output module for an industrial control device according to the aspect, the specific switch can be used to switch between passing and stopping a current in a function diagnosis, thus enabling stable current control during the function diagnosis.

(6) In the output module for an industrial control device according to the aspect, when the specific power supply corresponding to the diagnosis target switch applies the function diagnosis voltage, the control unit closes the specific switch for a predetermined period of time and causes the applied current being pulsed to flow to the diagnosis target switch.

In the output module for an industrial control device according to the aspect, during the function diagnosis of the diagnosis target switch, the pulsed current can be controlled by switching of the specific switch, thus enabling stable current control.

(7) The output module for an industrial control device according to the aspect may further comprise a diode provided between the junction point and each specific power supply and configured to prevent a current from flowing from each specific power supply to the load.

In the output module for an industrial control device according to the aspect, the diode prevents a current from flowing from the specific power supply to the load. In other words, a reverse current can be prevented appropriately.

(8) Another aspect of the present disclosure provides an industrial control device including the output module for an industrial control device according to the above-described aspect.

(9) The industrial control device according to the above-described aspect may be a programmable logic controller.

Embodiments of an output module for an industrial control device and the industrial control device according to the present disclosure will be described in detail below with reference to the drawings. In an example described below, the industrial control device according to the present disclosure is a programmable logic controller (PLC).

A. First Embodiment

A1. Configurations of PLC 1 and Output Module 3 for PLC 1:

A first embodiment will now be described with reference to FIGS. 1 to 5. First, a PLC configuration will be described with reference to FIG. 1. FIG. 1 is a schematic block diagram of an output module 3 for a PLC according to the first embodiment of the present disclosure. As shown in FIG. 1, a PLC 1 serving as an industrial control device includes a CPU module 2 that controls the overall operation of the device, the output module 3, and an input module (not shown). The PLC 1 controls the operation of an external load 4 connected to the output module 3. The load 4 is, for example, a driver for a flow control valve. The modules that form the PLC 1, including the CPU module 2 and the output module 3, can communicate with each other via a bus communication line.

The output module 3 controls the supply of power to the load 4, or more specifically, a power supply voltage Va, in accordance with an instruction received from the CPU module 2. The output module 3 is a digital output module including an output circuit 5, a control unit 6, and two connection terminals 7 and 8 to which the load 4 is connected.

The output circuit 5 includes a D/A converter 11, two switches (a first switch SwA, a second switch SwB), two current detection resistors (a first resistor 12, a second resistor 13), two specific power supplies (a first specific power supply 14, a second specific power supply 15), and two specific switches (a first specific switch SwCa, a second specific switch SwCb). The D/A converter 11 is installed upstream from the load 4 and in the present embodiment, serves as a main power supply that supplies the load 4 with main electric power.

The output circuit 5 is connected to the load 4 supplied with the power supply voltage Va. In the description below, the two switches SwA and SwB will be simply referred to as the switch SwA, SwB when no distinction is made between them. The two specific power supplies 14 and 15 will be simply referred to as the specific power supply 14, 15 when no distinction is made between them. Similarly, the two specific switches SwCa and SwCb will be simply referred to as the specific switch SwCa, SwCb when no distinction is made between them. The two current detection resistors 12 and 13 will be simply referred to as the resistor 12, 13 when no distinction is made between them.

The load 4 is connected between the first connection terminal 7 and the second connection terminal 8 provided downstream from the D/A converter 11. Each switch SwA, SwB, each resistor 12, 13, each specific power supply 14, 15, and each specific switch SwCa, SwCb are all provided downstream from the load 4 (the second connection terminal 8). Each switch SwA, SwB is a switch that electrically connects or disconnects the output circuit 5 and the load 4, and the switches are connected in parallel with each other downstream from the load 4.

A first diode 16 is provided downstream from a junction point P for a parallel connection and upstream from the first switch SwA. Similarly, a second diode 17 is provided downstream from the junction point P and upstream from the second switch SwB. The diodes 16, 17 prevent currents from flowing from the specific power supplies 14, 15 to the load 4.

Each specific power supply 14, 15 is a constant current source that outputs a constant current, such as a circuit capable of passing a current by outputting a voltage divided from the voltage of an external power supply module. The first specific power supply 14 is provided downstream from the first diode 16 and upstream from the first switch SwA. The second specific power supply 15 is provided downstream from the second diode 17 and upstream from the second switch SwB. Each specific power supply 14, 15 is used for a function diagnosis described later for each switch SwA, SwB.

The first specific switch SwCa is provided between the first specific power supply 14 and the first switch SwA. The first specific switch SwCa is a switch that electrically connects or disconnects the first specific power supply 14 and the first switch SwA. The second specific switch SwCb is provided between the second specific power supply 15 and the second switch SwB. The second specific switch SwCb is a switch that electrically connects or disconnects the second specific power supply 15 and the second switch SwB. Each of the switches SwA, SwB, SwCa, SwCb is, for example, a transistor such as a MOSFET. Each of the switches SwA, SwB, SwCa, SwCb may also be, for example, a mechanical relay. Each switch SwA, SwB, SwCa, SwCb is turned on or off in accordance with a binary control signal received from the control unit 6.

The first resistor 12 is connected between the first switch SwA and a ground (0 V) downstream from the first switch SwA. The second resistor 13 is connected between the second switch SwB and a ground (0 V) downstream from the second switch SwB. Each resistor 12, 13 generates a voltage in response to the passage of a current. The voltage is provided to the control unit 6 as a function diagnosis voltage Vb serving as a readback signal for a function diagnosis described later for the output circuit 5. Each resistor 12, 13 is a readback circuit and corresponds to a current detection unit. The function diagnosis voltage Vb serving as a readback signal corresponds to a current signal indicating whether the current has passed through the corresponding switch SwA, SwB. In the present embodiment, information indicating a current has passed is used as a current signal.

In this arrangement, the first switch SwA is linked with each of the first specific power supply 14, the first specific switch SwCa, and the first resistor 12. The second switch SwB is linked with each of the second specific power supply 15, the second specific switch SwCb, and the second resistor 13. The specific power supply 14, 15 applies the function diagnosis voltage Vb in a function diagnosis described later for the corresponding switch SwA, SwB. Each specific switch SwCa, SwCb is subjected to on-off control so that a current will not flow inappropriately from the corresponding specific power supply 14, 15 to the switch SwA, SwB when a function diagnosis is not being conducted.

The control unit 6 is a microcomputer including, for example, a CPU, a ROM, a RAM, and other input-output ports (not shown) and controls the overall operation of the output circuit 5. Specifically, the control unit 6 controls the opening and closing of each switch SwA, SwB, SwCa, SwCb. The control unit 6 also includes an external A/D converter (not shown), and through the A/D converter, reads the value of the function diagnosis voltage Vb from each resistor 12, 13 to compute the current value. The CPU of the control unit 6 reads a program stored in the ROM to execute the function diagnosis described later for the output circuit 5.

FIG. 2 is a table showing the open or closed state of the switches SwA, SwB and the specific switches SwCa, SwCb and expectation values of readback signals in processing including function diagnosis of the switches SwA and SwB conducted by the output module 3. As listed in the horizontal row of "1. Initialization" in FIG. 2, in the present embodiment, the first switch SwA is closed (Close), and the second switch SwB is open (Open) during normal operation of the load 4. That is, the first switch SwA is a switch used mainly during normal operation of the load 4, and the second switch SwB is a switch used for a function diagnosis described later for each switch SwA, SwB.

During normal operation of the load 4, each specific switch SwCa, SwCb is open. In a function diagnosis, the specific switch SwCa, SwCb linked with the switch SwA, SwB to be subjected to the function diagnosis (hereinafter, also referred to as the diagnosis target switch) is closed. Note that the opening and closing of each switch SwA, SwB, SwCa, SwCb in a function diagnosis will be described in detail below.

Figure 4:
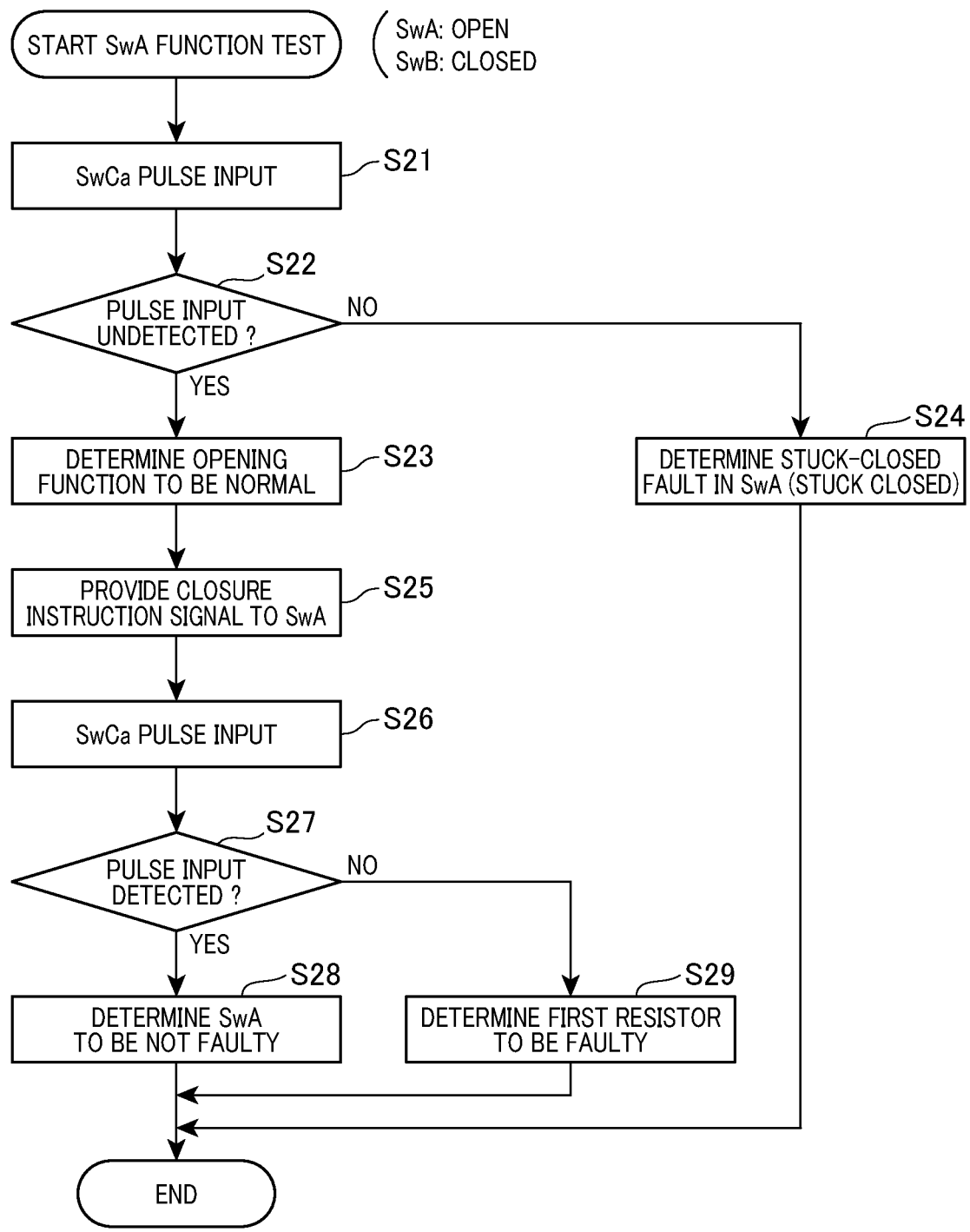
FIG. 4 is a flowchart showing a detailed process in the function diagnosis of a first switch.
Figure 5:
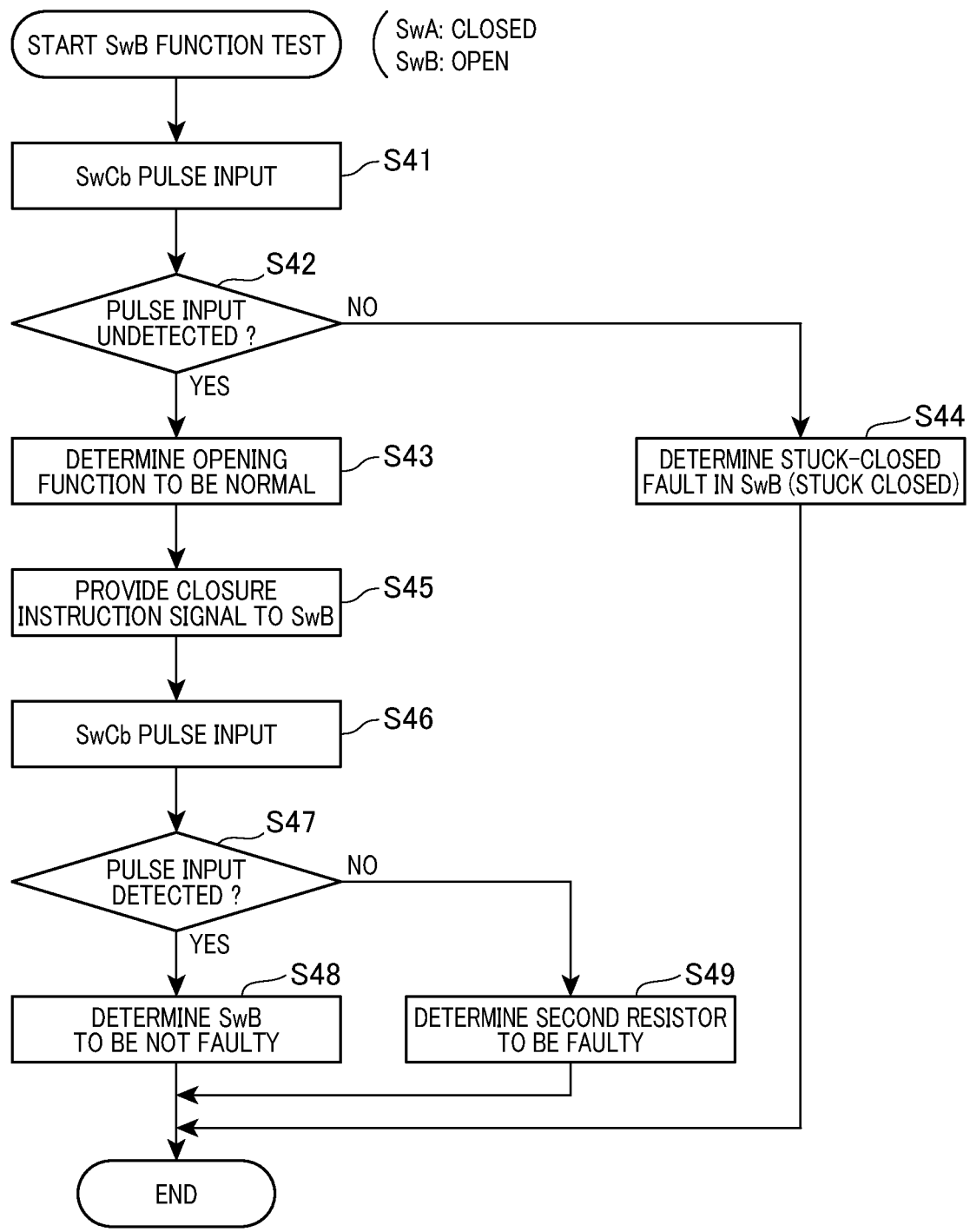
FIG. 5 is a flowchart showing a detailed process in the function diagnosis of a second switch.

A2. Switch Function Diagnosis:

A function diagnosis of the switch SwA, SwB conducted by the control unit 6 of the output module 3 will now be described with reference to FIGS. 2 to 5. FIG. 3 is a main flowchart showing the process of the function diagnosis of the switch SwA, SwB conducted by the output module 3 according to the first embodiment. FIG. 4 is a flowchart showing a detailed process in the function diagnosis of the first switch SwA. FIG. 5 is a flowchart showing a detailed process in the function diagnosis of the second switch SwB.

For functional safety purposes, the output module 3 of the PLC 1 conducts output diagnosis for regularly verifying whether the capability of the output circuit 5 to cut off the power fed to the load 4, or the capability to turn off the output circuit 5, is working properly. In the present embodiment, the output diagnosis conducted by confirming the ability to turn off the two switches SwA and SwB sequentially. The diagnosis detects a failed state in which the switch SwA, SwB is stuck closed due to, for example, contact welding and remains closed regardless of the reception of an opening instruction signal, and the opening control fails (hereinafter, referred to as a stuck-closed fault).

In the present embodiment, each switch SwCa, SwCb is subjected to a function diagnosis with electric power still supplied to the load 4. The open or closed state of each switch SwA, SwB, SwCa, SwCb during normal operation of the load 4 before the start of the function diagnosis process shown in FIG. 3 is, as described above, listed in the horizontal row of "1. Initialization" in FIG. 2. That is, the first switch SwA is closed, while the second switch SwB, the first specific switch SwCa, and the second specific switch SwCb are open.

In normal operation, the first switch SwA is selectively closed to keep the output circuit 5 on, allowing the supply of the power supply voltage Va from the D/A converter 11 to the load 4. In this supply, a current flows along a path from the D/A converter 11, through the load 4, the first switch SwA, to the first resistor 12. The output from the D/A converter 11 may be on or off before, after, and during the function diagnosis. In the present embodiment, the first switch SwA of the two switches SwA and SwB, which is usually used as a main switch, is subjected first to a function diagnosis. The function diagnosis is conducted on the first switch SwA and the second switch SwB in this order.

As shown in FIG. 3, when the function diagnosis is started, first in step 10 (hereinafter, steps are abbreviated as S), preparations are made for a test (diagnosis) on the first switch SwA, and in S20, the function test on the first switch SwA is performed. Next in S30, preparations are made for a test on the second switch SwB, and in S40, the function test on the second switch SwB is performed. During the function test on the first switch SwA in S20, the first switch SwA corresponds to the diagnosis target switch. During the function test on the second switch SwB in S40, the second switch SwB corresponds to the diagnosis target switch.

The function diagnosis will be described in further detail below. In the preparations for the test on the first switch SwA in S10, the first switch SwA is opened, and the second switch SwB is closed, as listed in the horizontal row of "2. Preparation for SwA Test" in FIG. 2. Note that both the switches SwA and SwB are closed for an instant between "1. Initialization" and "2. Preparation for SwA test." In the processing of "2. Preparation for SwA Test," selectively closing the second switch SwB keeps the output circuit 5 on and the load 4 supplied with the power supply voltage Va from the D/A converter 11. In this supply, a current flows along a path from the D/A converter 11, through the load 4, the second switch SwB, to the second resistor 13.

The function test on the first switch SwA will now be described with reference to FIG. 4. As shown in FIG. 4, first in S21, the first specific switch SwCa is closed for a predetermined period of time, and a pulsed current (hereinafter referred to as a pulse current) is input from the first specific power supply 14. In the processing of S21, the first switch SwA and the second specific switch SwCb are open, while the second switch SwB and the first specific switch SwCa are closed, as listed in the horizontal row of "3. Opening Function Test on SwA" in FIG. 2.

If the first switch SwA is closed, the pulse current input from the first specific power supply 14 will flow along a path from the first specific switch SwCa through the first switch SwA to the first resistor 12. Note that the pulse current corresponds to an applied current. Next in S22, it is determined whether the pulse input is undetected. The determination as to whether the pulse input is undetected is, more specifically, performed by computing the value of the current from the function diagnosis voltage Vb provided by the first resistor 12 to the control unit 6 as a readback signal and determining whether the pulse current value based on the function diagnosis voltage Vb appears in the readback signal.

The value of the current flowing in response to the function diagnosis voltage Vb from the specific power supply 14, 15 is set to be greater than the value of the current flowing in response to the voltage from the D/A converter 11 in normal operation. Specifically, the value of a current flowing in response to a voltage from the D/A converter 11 in normal operation is about 4 mA to 20 mA, whereas the value of a current flowing in response to the function diagnosis voltage Vb from the specific power supply 14, 15 is set be greater, or about, 60 mA. Thus, even if a main current includes a pulse current for some reason, the current value is clearly smaller than the current value from the function diagnosis voltage Vb and accordingly not confused with the applied current in the function diagnosis.

In S22, if the pulse input is undetected (S22: YES), the processing proceeds to S23, in which the opening function is determined to be normal, that is, the opening control is determined to be normally active for the first switch SwA. This is because with the first switch SwA correctly open, the applied current for the test (hereinafter, also referred to as the test current) from the first specific power supply 14 does not flow through the first switch SwA or the first resistor 12, and the state with the pulse current being undetected is correct and consistent with the expectation value of the readback signal.

In contrast, if the pulse input is detected in S22 (S22: NO), the processing proceeds to S24, in which a stuck-closed fault is diagnosed, that is, the opening control is diagnosed as failing for the first switch SwA. The pulse input being detected means that the test current from the first specific power supply 14 has flowed through the first switch SwA and the first resistor 12, and the first switch SwA seems not to be open regardless of the reception of an opening instruction.

In the determination in S24, no correct current signal may have been sent due to a failure in the first resistor 12. However, the determination is based on the assumption that the readback function of the first resistor 12 has been normally used in normal operation immediately before the function diagnosis. Furthermore, for the output module 3 having the above-described arrangement, the first resistor 12 is typically subjected to other specific function diagnosis. Meanwhile, the opening function test on the first switch SwA is performed for the first time in the present function diagnosis, and thus it is highly likely that a failure has occurred in the first switch SwA rather than in the first resistor 12. Consequently, in S24, the first switch SwA is determined to have a stuck-closed fault.

After the opening function is determined to be normal in S23, a closure instruction signal is provided to the first switch SwA in S25. Next in S26, a pulse current is input again from the first specific power supply 14. In the processing of S26, the first switch SwA, the second switch SwB, and the first specific switch SwCa are closed, while the second specific switch SwCb is open, as listed in the horizontal row of "4. Closure Function Test on SwA" in FIG. 2.

Next in S27, it is determined whether the pulse input is detectable. In S27, if the pulse input is detected (S27: YES), the processing proceeds to S28, in which the first switch SwA is determined to be not faulty. That is, the opening control is determined to be normal in S23, and the closure control is also determined to be normally active for the first switch SwA. This is because with the first switch SwA correctly closed, the test current from the first specific power supply 14 flows through the first switch SwA and the first resistor 12, and the state with the pulse current being detected is correct and consistent with the expectation value of the readback signal.

In contrast, if the pulse input is undetected in S27 (S27: NO), the processing proceeds to S29, in which the first resistor 12 is diagnosed as having a fault. The pulse input being undetected means that the test current from the first specific power supply 14 has not flowed through the first switch SwA or the first resistor 12, and thus the current signal from the first resistor 12 is likely to be erroneous.

In the determination in S29, the first resistor 12 may not be faulty but the first switch SwA may have failed to be correctly closed, or may be stuck open (also referred to as a stuck-open fault). However, the determination is based on the assumption that the first switch SwA has been used normally in the closed state in normal operation immediately before the function diagnosis. Thus, it is highly unlikely to be stuck open.

In terms of functional safety, even if a stuck-open fault occurs after the start of the function diagnosis, without a stuck-closed fault, an emergency shutdown function will be activated properly. Thus, the result of diagnosis as a stuck-open fault is not of much benefit. In the case of the occurrence of a stuck-open fault in the first switch SwA, although an attempt is made to open the first switch SwA after the function diagnosis in order to return the load 4 to normal operation, the load 4 cannot be driven because no power is supplied. This state allows clear detection of the stuck-open fault in the first switch SwA.

In the determination in S29, it is also likely that the first specific switch SwCa is not correctly closed and the test current has not really flowed. However, the specific switch SwCa, SwCb is opened or closed merely during a function diagnosis of the switch SwA, SwB and used less frequently than the switch SwA, SwB. The specific switch SwCa, SwCb is thus highly unlikely to be faulty.

In the function diagnosis, the likelihood and diagnosis priority of faults in the components included in the output module 3 are listed in descending order as follows:
1. A stuck-closed fault in the switch SwA, SwB (an abnormality in opening control),
2. An error in a current signal from the resistor 12, 13,
3. A stuck-open fault in the switch SwA, SwB (an abnormality in closure control), and
4. A fault in the specific switch SwCa, SwCb.

By the above criteria, the first resistor 12 is determined to be faulty in S29 in the present embodiment. After the diagnosis in each of S24, S28, and S29, the present processing routine is ended. In the case where the first resistor 12 is determined to be faulty in the processing of S29, the function of the first resistor 12 may be checked in another function diagnosis. If the diagnosis determines the first resistor 12 to be normal, the first switch SwA may be determined to have a stuck-closed fault.

After the function diagnosis of the first switch SwA ends as described above, the second switch SwB is then subjected to a function diagnosis in substantially the same manner as the function diagnosis of the first switch SwA. In the preparations for the test on the second switch SwB in S30 shown in FIG. 3, the second switch SwB is opened. Although FIG. 2 does not describe the open or closed state of each switch SwA, SwB, SwCa, SwCb after the preparations for the test on the second switch SwB (S30), the first switch SwA is closed, and all the other switches are open after the preparations for the test on the second switch SwB (S30).

As shown in FIG. 5, when the function diagnosis of the second switch SwB is started, first in S41, the second specific switch SwCb is closed, and a pulse current is input from the second specific power supply 15. In the processing of S41, the second switch SwB and the first specific switch SwCa are open, while the first switch SwA and the second specific switch SwCb are closed, as listed in the horizontal row of "5. Opening Function Test on SwB" in FIG. 2.

If the second switch SwB is closed, the input pulse current will flow along a path from the second specific switch SwCb through the second switch SwB to the second resistor 13. Next in S42, it is determined whether the pulse input is undetected. In S42, if the pulse input is undetected (S42: YES), the processing proceeds to S43, in which the opening function is determined to be normal, that is, the opening control is determined to be normally active for the second switch SwB. This is because with the second switch SwB correctly open, the test current from the second specific power supply 15 does not flow through the second switch SwB or the second resistor 13, and the state with the pulse current being undetected is correct and consistent with the expectation value of the readback signal.

In contrast, if the pulse input is detected in S42 (S42: NO), the processing proceeds to S44, in which a stuck-closed fault is diagnosed, that is, the opening control is diagnosed as failing for the second switch SwB. The pulse input being detected means that the test current from the second specific power supply 15 has flowed through the second switch SwB and the second resistor 13, and the second switch SwB seems not to be open regardless of the reception of an opening instruction.

In the determination in S44, no correct current signal may have been sent due to a failure in the second resistor 13. However, the determination is based on the assumption that the second switch SwB has been closed to pass a main current through the load 4 in the above function diagnosis of the first switch SwA, and the readback function of the second resistor 13 has been normally used in this function diagnosis. Meanwhile, the opening function test on the second switch SwB is performed for the first time in the present function diagnosis, and thus it is highly likely that a failure has occurred in the second switch SwB rather than in the second resistor 13. Consequently, in S44, the second switch SwB is determined to have a stuck-closed fault.

After the opening function is determined to be normal in S43, a closure instruction signal is provided to the second switch SwB in S45. Next in S46, a pulse current is input again from the second specific power supply 15. In the processing of S46, the first switch SwA, the second switch SwB, and the second specific switch SwCb are closed, while the first specific switch SwCa is open, as listed in the horizontal row of "6. Closure Function Test on SwB" in FIG. 2.

Next in S47, it is determined whether the pulse input is detected. In S47, if the pulse input is detected (S47: YES), the processing proceeds to S48, in which the second switch SwB is determined to be not faulty. That is, the opening control is also determined to be normal in S43, and the closure control is also determined to be is normally active for the second switch SwB. This is because with the second switch SwB correctly closed, the test current from the second specific power supply 15 flows through the second switch SwB and the second resistor 13, and the state with the pulse current being detected is correct and consistent with the expectation value of the readback signal.

In contrast, if the pulse input is undetected in S47 (S47: NO), the processing proceeds to S49, in which the second resistor 13 is diagnosed as having a fault. The pulse input being undetected means that the test current from the second specific power supply 15 has not flowed through the second switch SwB or the second resistor 13, and thus the current signal from the second resistor 13 seems to be erroneous.

In the determination in S49, the second resistor 13 may not be faulty but the second switch SwB may have failed to be correctly closed, or may be stuck open and have a stuck-open fault. However, the determination is based on the assumption that the load 4 has operated normally with the second switch SwB closed in the function diagnosis of the first switch SwA (FIG. 4). Thus, it is highly unlikely to be stuck open.

Furthermore, it is also likely that the second specific switch SwCb is not correctly closed and the applied current has not really flowed. However, this likelihood is slim in view of the likelihood and diagnosis priority of faults described in detail above. Consequently, the second resistor 13 is determined to be faulty in S49 in the present embodiment. After the diagnosis in each of S44, S48, and S49, the present processing routine is ended.

A3. Advantageous Effects:

(1) As described above, in the output module 3 of the PLC 1 according to the first embodiment, the power fed to the load 4 is not cut off during the function diagnosis of each switch SwA, SwB because the switch SwA, SwB other than the diagnosis target is closed. Additionally, the diagnosis is conducted based on whether a test current has flowed through the diagnosis target switch in response to the application of the function diagnosis voltage Vb by the specific power supply 14, 15 corresponding to the diagnosis target switch SwA, SwB. Thus, the function diagnosis is allowed even with zero output from the D/A converter 11 serving as a main power supply for supplying power to the load 4. That is, the capability of turning off the output circuit 5 can be diagnosed without cutting off the power fed to the load 4 in the diagnosis and even with zero output to the load 4.

(2) In the first embodiment, the function diagnosis of each switch SwA, SwB determines a fault in the resistor 12, 13 in S29 and S49. That is, the patterns of opening and closing of the multiple switches SwA, SwB and the patterns of application of the function diagnosis voltage Vb can be defined to enable identification of where a fault has occurred in the output circuit 5, or the location of the fault, based on the likelihood and diagnosis priority of faults.

(3) In the first embodiment, the value of a current flowing in response to the function diagnosis voltage Vb from the specific power supply 14, 15 is set to be greater than the value of a current flowing in response to the power supply voltage Va from the D/A converter 11 in normal operation. Thus, during the diagnosis, even if a main current flows with something like a pulse current, the current value is clearly smaller than the current value from the function diagnosis voltage Vb and accordingly not confused with the test current. Furthermore, for a small test current, the test current may be, for example, drawn by a reversed main current away from the switch SwA, SwB, and the signal of the test current cannot be detected. This problem can be avoided by causing the specific power supply 14, 15 to pass a current larger than a current from the D/A converter 11 serving as a main power supply. This scheme enables easy and accurate determination as to whether the pulse input in the function diagnosis is detected (S22, S27, S42, S47).

(4) In the first embodiment, the specific switch SwCa, SwCb is provided between each specific power supply 14, 15 and the switch SwA, SwB corresponding to the specific power supply 14, 15. This arrangement allows switching between passing and stopping the function diagnosis current downstream of the specific power supply 14, 15, thus enabling stable current control compared with a case with currents constantly flowing without the specific switch SwCa, SwCb. The arrangement also minimizes the power consumption of the specific power supply 14, 15.

B. Second Embodiment

A second embodiment of the present disclosure will now be described with reference to FIG. 6. The second embodiment is different from the first embodiment in that the output module 3 of the PLC 1 does not include the second resistor 13. The output module 3 includes merely one resistor (the first resistor 12) as a current detection unit. The other components in the output module 3 of the PLC 1 according to the second embodiment are the same as in the output module 3 of the PLC 1 according to the first embodiment, and thus a detailed description thereof will be omitted by using the same reference signs to denote the same components.

Figure 6:
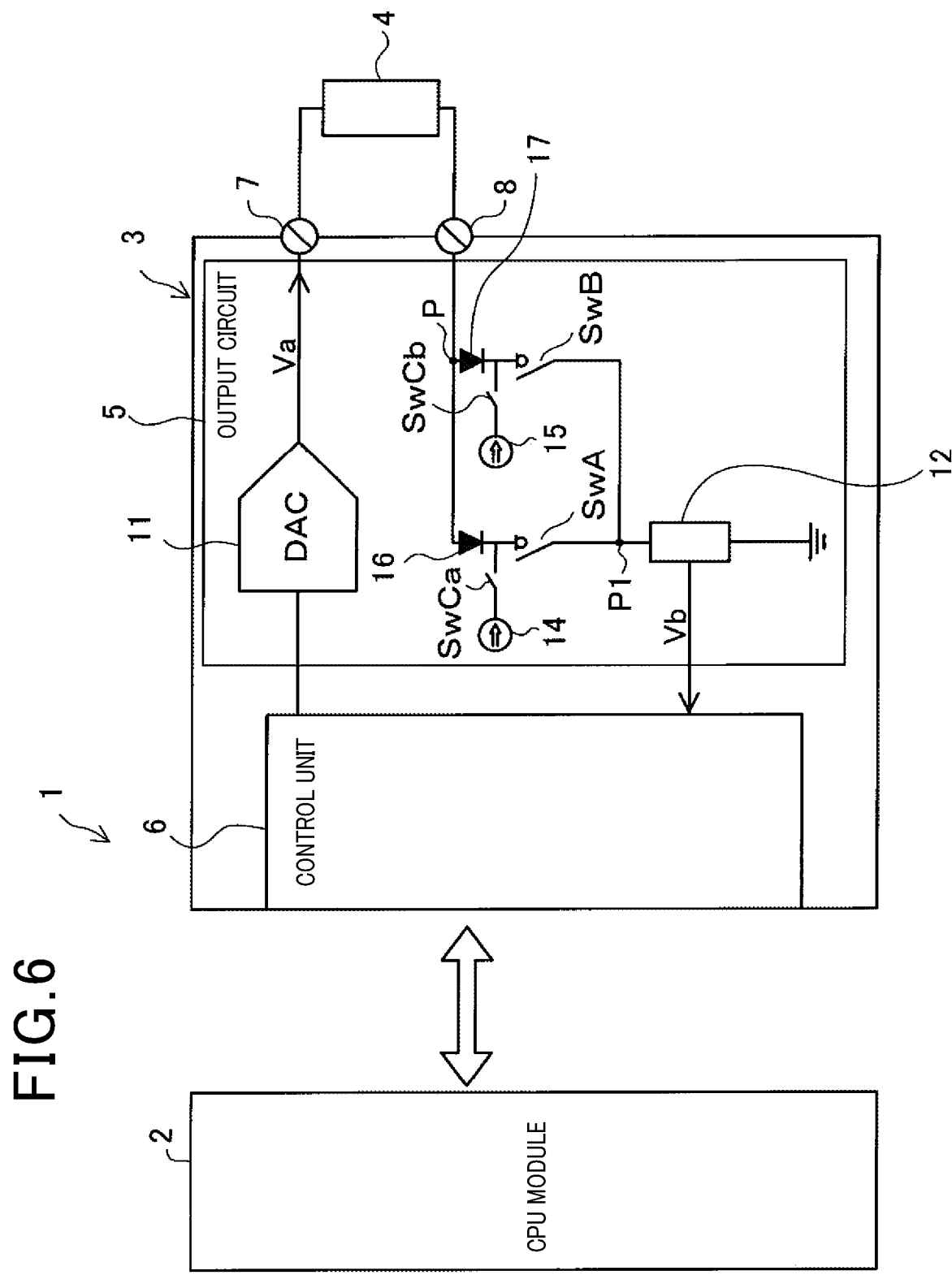
FIG. 6 is a schematic block diagram of an output module for a PLC according to a second embodiment of the present disclosure.

As shown in FIG. 6, the first resistor 12 is downstream from the parallel-connected switches SwA and SwB and connected between a ground (0 V) and a junction P1 of the parallel connection. Also in the second embodiment, the same function diagnosis as in the first embodiment is conducted. In the second embodiment, the processing of S49 (see FIG. 5) is performed with the second resistor replaced with the first resistor.

Also in the second embodiment, both the switches SwA and SwB are closed for an instant between "1. Initialization" and "2. Preparation for SwA Test" as in the first embodiment. In this state, a current passing through the load 4 in response to the power supply voltage Va flows along a path from the D/A converter 11, through the load 4, the first switch SwA, the second switch SwB, to the first resistor 12.

The second embodiment can achieve the same advantageous effects as the first embodiment. Additionally, in the second embodiment, the current flowing in the load 4 between "1. Initialization" and "2. Preparation for SwA Test" can be computed by detecting one readback signal from the first resistor 12. The computation is easier than computation carried out by detecting multiple readback signals from different resistors, and enables the current value to be calculated with higher accuracy. Moreover, the output module 3 may include fewer components to simplify the device configuration.

C. Other Embodiments (C1) In the first embodiment, the function diagnosis starts from the first switch SwA. However, the function diagnosis of the second switch SwB may be conducted earlier. In the function diagnosis of each switch SwA, SwB, although the opening function test has been performed earlier, the closure function test may be performed earlier.

(C2) In the first embodiment, the switches SwA, SwB, the resistors 12, 13, the specific power supplies 14, 15, and the specific switches SwCa, SwCb are all provided downstream from the load 4. However, these components may be provided upstream, or between the D/A converter 11 and the load 4.

(C3) In the first embodiment, the D/A converter 11 is used as a main power supply and installed inside the output module 3. Instead, another power supply provided outside the output module 3 may be connected upstream of the load 4.

(C4) In the first embodiment, the two switches SwA and SwB are provided. However, three or more switches may be installed. The function diagnosis for three or more switches may be conducted when at least any one switch other than the diagnosis target switch is closed. Furthermore, the output module 3 may include multiple control units 6.

(C5) In the first embodiment, the first switch SwA is used as a main switch for turning on the output circuit 5 in normal operation of the load 4. However, the main switch may not necessarily be a single switch. For example, multiple switches may be used in turn during normal operation.

(C6) In the first embodiment, each specific switch SwCa, SwCb may not be provided. In this case, the specific power supply 14, 15 may be switched from off to on to pass the function diagnosis current. The applied test current may not be a pulse current.

(C7) In each of the embodiments, although the present disclosure has been described in detail with the programmable logic controller as an example of the industrial control device, the present disclosure is not limited to these embodiments. The industrial control device may not be a programmable logic controller. Examples of such industrial control devices include a robot controller and a machine tool controller.

(C8) In each of the embodiments, although the control unit has been described as a microcomputer including a CPU, a ROM, a RAM, and other input-output ports, the present disclosure is not limited to these embodiments. For example, the control unit may include various semiconductor integrated circuits other than a CPU, including a programmable logic device (PLD) such as a field-programmable gate array (FPGA) or a field-programmable analog array (FPAA), and an arithmetic unit such as an application specific integrated circuit (ASIC), a micro processor unit (MPU), or a micro controller unit (MCU). The control unit may include a single semiconductor integrated circuit or multiple semiconductor integrated circuits.

(C8) In each of the embodiments, although the current detection unit has been described as a resistor, the present disclosure is not limited to these embodiments. The current detection unit may be, for example, a detection mechanism that is a current transformer mechanism.

The present disclosure is not limited to the above embodiments but may be implemented in a variety of ways without departing from the spirit and scope thereof. For example, the technical features in each embodiment corresponding to the technical features in the aspects described in the Summary section may be replaced or combined as appropriate so as to solve some or all of the above-described problems or achieve some or all of the above-described effects. Unless described herein as being necessary, the technical features may be deleted as appropriate.

The invention claimed is:
1. An output module for an industrial control device, the output module comprising:
an output circuit to be connected to a load supplied with power from a main power supply; and a control unit configured to control operation of the output circuit, thereby controlling supply of the power from the main power supply to the load, wherein the output circuit includes two or more switches connected in parallel with each other and configured to switch between supply and cutoff of the power from the main power supply to the load, a specific power supply separate from the main power supply, provided for each of the switches between the corresponding switch and a junction point in the parallel connection of the switches, and configured to apply a function diagnosis voltage used for a function diagnosis of the corresponding switch, and a current detection unit provided for each of the switches and configured to, in response to the application of the function diagnosis voltage, output a current signal indicating whether an applied current has flowed through the switch, to the control unit, and wherein the control unit conducts a function diagnosis including at least determination as to whether opening control is normally active for a diagnosis target switch to be subjected to the function diagnosis among the switches based on the current signal from the current detection unit, while leaving at least any one switch other than the diagnosis target switch in a closed state.

2. The output module for the industrial control device according to claim 1, wherein the control unit, in the function diagnosis, opens the diagnosis target switch and reads the current signal from the current detection unit corresponding to the diagnosis target switch in response to the application of the function diagnosis voltage from the specific power supply corresponding to the diagnosis target switch, and in response to determination that the applied current has not flowed through the diagnosis target switch, the control unit diagnoses the opening control for the diagnosis target switch as being normally active, and in response to determination that the applied current has flowed through the diagnosis target switch, the control unit diagnoses the opening control for the diagnosis target switch as not being normally active.

3. The output module for the industrial control device according to claim 1, wherein the control unit, in the function diagnosis, closes the diagnosis target switch and reads the current signal from the current detection unit corresponding to the diagnosis target switch in response to the application of the function diagnosis voltage from the specific power supply corresponding to the diagnosis target switch, and in response to determination that the applied current has flowed through the diagnosis target switch, the control unit diagnoses closure control for the diagnosis target switch as being normally active, and in response to determination that the applied current has not flowed through the diagnosis target switch, the control unit diagnoses the current detection unit corresponding to the diagnosis target switch as being faulty.

4. The output module for the industrial control device according to claim 1, wherein the applied current associated with the function diagnosis voltage applied by the specific power supply has a value greater than a value of a current supplied from the main power supply.

5. The output module for the industrial control device according to claim 1, wherein each specific power supply and the switch corresponding to the specific power supply have a specific switch therebetween.

6. The output module for the industrial control device according to claim 5, wherein when the specific power supply corresponding to the diagnosis target switch applies the function diagnosis voltage, the control unit closes the specific switch for a predetermined period of time and causes the applied current to flow in a pulsed manner to the diagnosis target switch.

7. The output module for the industrial control device according to claim 1, further comprising:

a diode provided between the junction point and each specific power supply and configured to prevent a current from flowing from each specific power supply to the load.

8. An industrial control device comprising:

an output module for the industrial control device according to claim 1.

9. The industrial control device according to claim 8, wherein the industrial control device is a programmable logic controller.

* * * * *